(12) United States Patent
Chawla

(10) Patent No.: US 8,037,336 B2
(45) Date of Patent: Oct. 11, 2011

(54) SPREAD SPECTRUM CLOCK GENERATION

(75) Inventor: Nitin Chawla, Noida (IN)

(73) Assignee: STMicroelectronics PVT, Ltd., Uttar Pradesh (IN)

( * ) Notice: Subject to any disclaimer, the term of this patent is extended or adjusted under 35 U.S.C. 154(b) by 621 days.

(21) Appl. No.: 11/803,725

(22) Filed: May 15, 2007

(65) Prior Publication Data

US 2008/0129351 A1    Jun. 5, 2008

(30) Foreign Application Priority Data

May 15, 2006   (IN) .......................... 1193/DEL/2006

(51) Int. Cl.
*H03L 7/06* (2006.01)

(52) U.S. Cl. ........ 713/401; 713/400; 713/500; 713/501; 713/502; 713/503; 713/600; 713/601; 327/147; 327/150; 327/156

(58) Field of Classification Search .......... 713/400–401, 713/500–503, 600–601; 327/147, 150, 156
See application file for complete search history.

(56) References Cited

U.S. PATENT DOCUMENTS

| 5,608,354 | A * | 3/1997 | Hori ............................. 331/1 A |
| 5,907,483 | A * | 5/1999 | Iio et al. .......................... 363/58 |
| 2006/0290391 | A1 * | 12/2006 | Leung et al. .................. 327/147 |
| 2007/0019711 | A1 * | 1/2007 | Mallinson et al. ............ 375/130 |

* cited by examiner

*Primary Examiner* — M Elamin

(57) ABSTRACT

The present disclosure provides a spread spectrum clock generation system having a digitally controlled phase locked loop (PLL) and a digital frequency profile generator to create a near optimal frequency modulation profile for the purpose of achieving spectral flatness in the output frequency modulated clock. The circuit is combined with a multilevel error feedback noise shaping structure that provides the required noise transfer function for the quantization noise but maintains a unity gain all pass signal transfer function. This arrangement offers minimal degradation of the in-band signal-to-noise ratio (SNR) at the cost of higher out-of-band noise.

20 Claims, 13 Drawing Sheets

Architecture of Strobe loading:

Modulating signal for Down-spread for frequency modulation

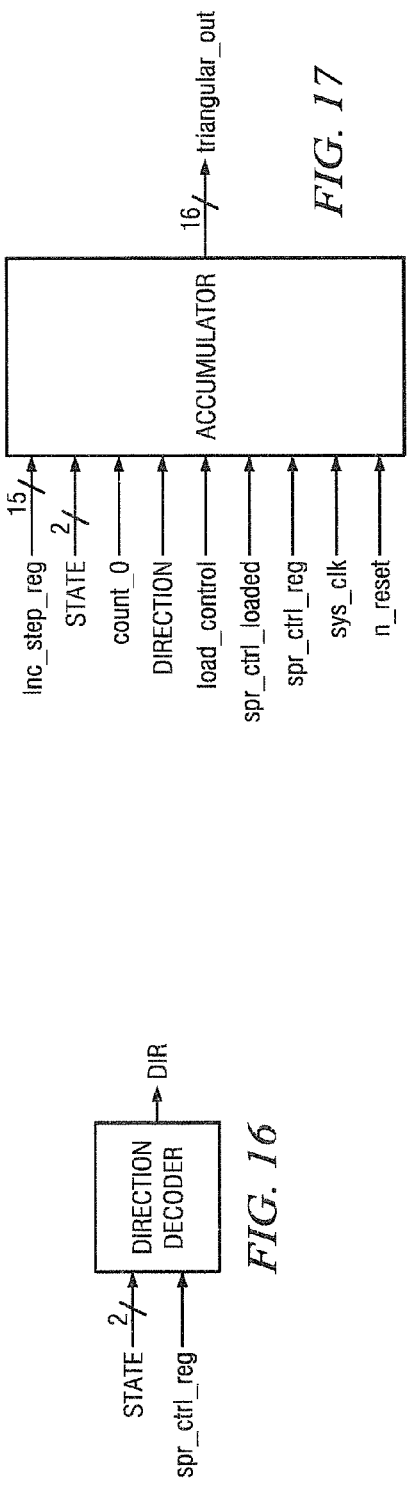
FIG. 17
FIG. 16
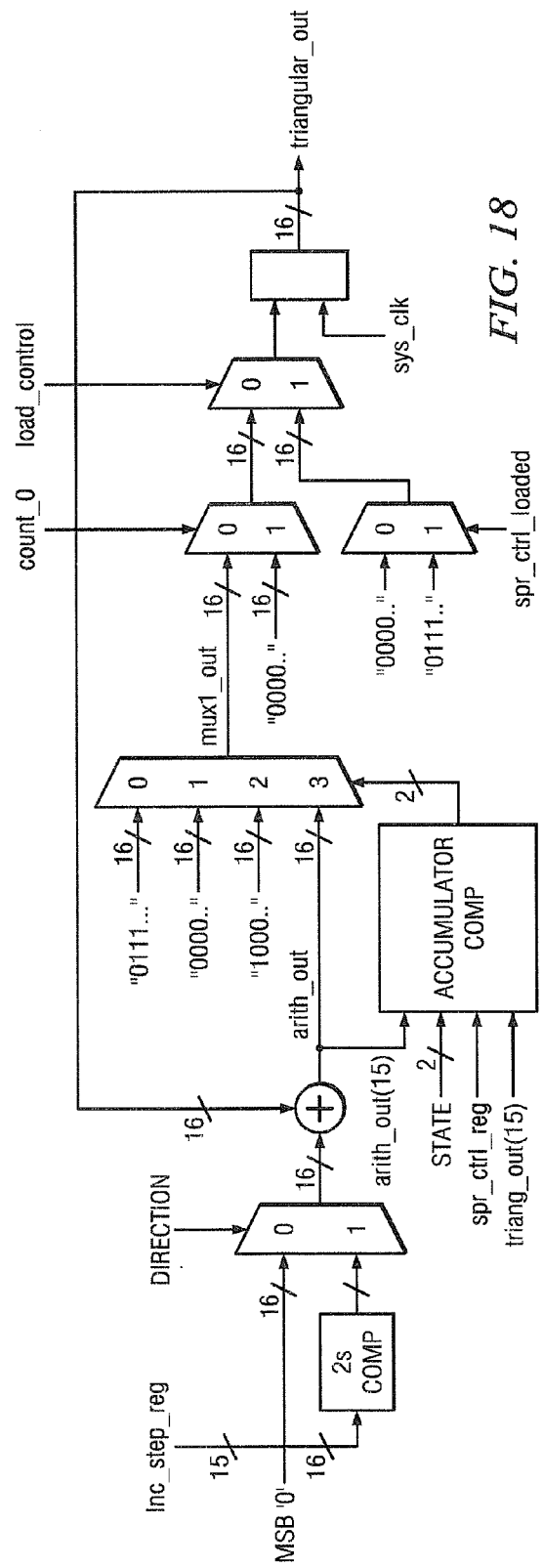
FIG. 18

SPREAD SPECTRUM CLOCK GENERATION

CROSS-REFERENCE TO RELATED APPLICATIONS

The present application is related to Indian Patent Application No. 1193/Del/2006, filed May 15, 2006, entitled "SPREAD SPECTRUM CLOCK GENERATION SYSTEM". Indian Patent Application No. 1193/Del/2006 is assigned to the assignee of the present application and is hereby incorporated by reference into the present disclosure as if fully set forth herein. The present application hereby claims priority under 35 U.S.C. §119(a) to Indian Patent Application No. 1193/Del/2006.

TECHNICAL FIELD

This disclosure relates to a spread spectrum clock Generation system. In particular it relates to a spread spectrum clock generation system that provides both center-spread and down-spread operating modes and requires minimal silicon area for on-chip implementation.

BACKGROUND

Modern digital electronic circuits are required to operate at increasing clock frequencies. At the same time there is a growing demand for compliance with stringent EMI/EMC standards. These requirements are contradictory in nature and therefore difficult to comply with. High-volume, low-cost integrated circuit implementations impose additional requirements of minimal silicon area utilization.

FIG. 1 shows a typical high-frequency clock generator circuit based on a Phase-Locked Loop (PLL) for generating a high frequency clock signal using a lower frequency input clock source. The input clock fin is fed to one input of Phase Difference Detector PDD. The output of PDD drives a Charge Pump CP for producing a control signal which, after smoothing by Low-pass filter LPF, is fed to the control input of a Voltage Controlled Oscillator VCO. The output of VCO is the high-frequency output clock fout. The VCO output is also fed back to a second input of PDD after being divided down in frequency by N-bit Divider DIV, thereby completing the control loop. This arrangement is likely to generate significant EMI owing to its narrow frequency emission spectrum.

Spread spectrum techniques offer a possible solution to meeting the requirements of EMI/EMC compliance. By using a spread spectrum clock as the source clock for that part of the logic which is switching at high speed the EMI emission of the device is significantly reduced and can be maintained within the limits set by regulatory bodies such as the FCC and CISPR. This technique distributes the energy of the clock signal, which is typically concentrated at its fundamental and harmonics, over a wider frequency band around the fundamental and harmonic frequencies thereby lowering the signal power level within a defined narrow frequency band. However existing methods of Spread Spectrum generation are limited in the effectiveness of the spectral distribution. In addition, these methods are expensive in terms of silicon area when implemented in integrated circuits.

SUMMARY

The object of the present disclosure is to provide a spread spectrum based high-frequency clock generator that provides a uniform frequency spectrum and is cost-effective in terms of silicon area in an integrated circuit.

To achieve the stated objective, one embodiment of the present disclosure uses a Digital Frequency Profile Generator to create a near optimal frequency modulation profile for the purpose of achieving spectral flatness in the output frequency modulated clock. This circuit is combined with a multilevel error feedback noise shaping structure that provides the required Noise Transfer Function for the quantization noise but maintains a unity gain all pass signal transfer function. This arrangement offers minimal degradation of the in-band Signal-to-Noise-Ratio (SNR) at the cost of higher out-of-band noise.

The system offers flexibility in setting the nominal clock frequency by providing two operational modes—a "center-spread mode" in which the nominal frequency is the original clock frequency and a "down-spread mode" in which the maximum frequency is the original clock frequency and the nominal frequency is offset below the original clock frequency by an amount which is a function of the configurable modulation depth.

The present disclosure provides a low-cost design as it does not require separate profile generators for the two modes of operation, nor does it require a "look-ahead circuit" for calculating the offset compensation dynamically in accordance with the configured modulation depth value. A look-ahead circuit implementation would either be big in area if it is designed to calculate the final compensation offset in a single cycle, or would require increase startup and compensation time if it calculates sequentially. In the Look-ahead circuit, scheme the compensation value is passed through an arithmetic logic unit that takes one input as this offset and the other as the high precision profile generator output. The wide bit width requirement would also result in increased area.

This present disclosure overcomes these disadvantages and provides an area efficient solution with no time penalty by sharing the hardware of the profile generator for both the center and down spread modes and then translating the otherwise modulation depth dependent offset compensation to a static offset correction in reduced bit width form after the noise shaper with a minimal-area hardwired offset addition to the noise shaper output. The noise shaper output then directly controls the modulus of the multi-modulus PLL or pass through a DAC and influences the control voltage of the VCO to finally generate the spread spectrum clock.

Noise shaper order, profile generator internal fixed point precision and number of levels in the multilevel noise-shaper can all be configured thus making it a generic solution for different application needs and accuracies.

In one embodiment, the present disclosure provides a spread spectrum clock generation system. The system includes a digitally controlled phase locked loop (PLL) circuit. The system also includes a digital frequency profile generator connected to the digital control input of said PLL circuit.

In another embodiment, the present disclosure provides a method for generating a spread spectrum clock. The method includes providing a digitally controlled phase locked loop (PLL) circuit. The method also includes modulating the frequency generated by said PLL circuit by applying a controlled modulating signal to the digital control input of said PLL circuit.

In still another embodiment, the present disclosure provides For use in spread spectrum clock generation, a system for providing center spread and down spread operating modes. The system includes a digitally controlled phase locked loop (PLL) circuit. The system also includes a digital frequency profile generator connected to the digital control input of said PLL circuit. The digital frequency profile generator includes a triangular wave generator. The digital frequency profile generator also includes a second order sigma-delta modulator (SDM) connected to the output of said triangular wave generator wherein said triangle wave generator comprises a synchronizer to synchronize input asynchronous amplitude and frequency values to an internal system clock.

Other technical features may be readily apparent to one skilled in the art from the following figures, descriptions and claims.

BRIEF DESCRIPTION OF THE DRAWINGS

For a more complete understanding of this present disclosure and its features, reference is now made to the following description, taken in conjunction with the accompanying drawings, in which:

FIG. 16 shows a Direction Decoder according to one embodiment of the present disclosure;

FIG. 17 shows an Accumulator according to one embodiment of the present disclosure;

FIG. 18 shows one implementation of the Accumulator according one embodiment of the present disclosure;

DETAILED DESCRIPTION

The Spread Spectrum Clock Generation (SSCG) controller provides a frequency modulated clock wave form at the PLL output—a process known as "dithered PLL" operation.

Figure 1:
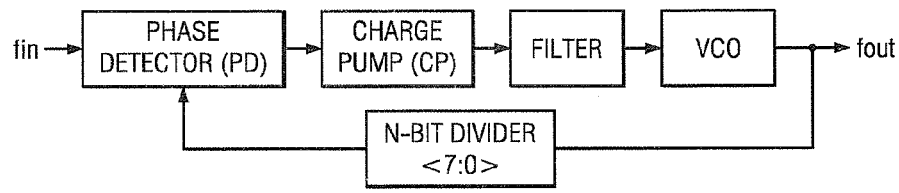
FIG. 1 shows a typical high-frequency clock generator circuit based on a Phase-Locked Loop (PLL)
Figure 2:
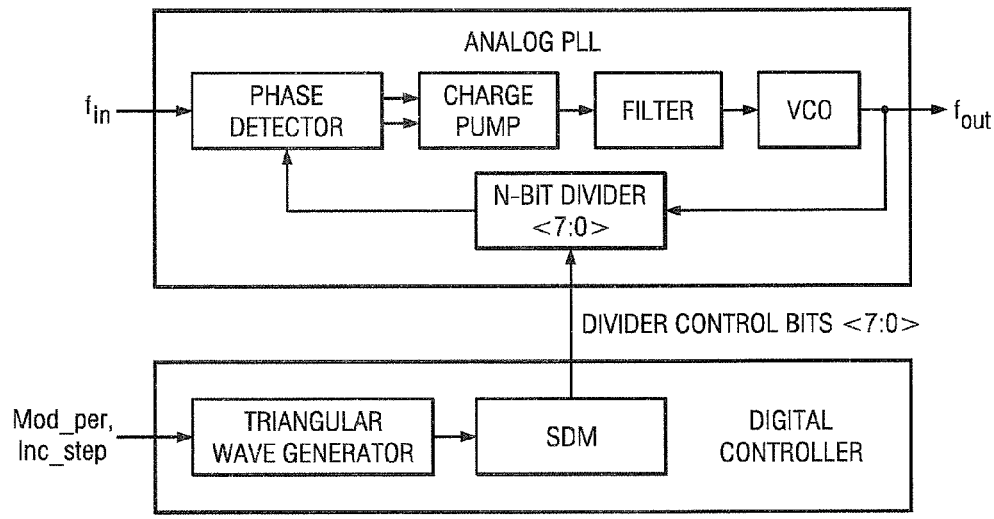
FIG. 2 shows the block diagram of Dithered PLL, according to one embodiment of the present disclosure.

The block diagram of the disclosure is shown in FIG. 2. The Spread Spectrum Clock Generation (SSCG) controller consists of 2 main parts: a) an Analog PLL—as shown in the prior art, but modified to accept a control input from; and b) a Digital controller.

The Digital controller, which is connected at the control input of the feedback loop divider generates a linear (triangular) modulation profile, which, after passing through the internal Sigma Delta Modulator, is added to the nominal division count of the loop divider (depending on the spread mode (center/down spread) and the result is provided as the feedback loop divider control bits of the PLL.

The Digital Controller implements frequency modulation, by varying the n-bit feedback divider value. As the modulation depth cannot be allowed to exceed the recommended range, the divider value cannot be allowed to be varied beyond the specified limits. This restricts the change in the divider value to only a few levels. A high-resolution (16 bits in this case but could be any other resolution as well) modulating signal profile is applied to a sigma-delta modulator which maps this to a fewer levels. A triangular wave is chosen as the modulating signal for obtaining a flatter spectral profile.

Figure 3:
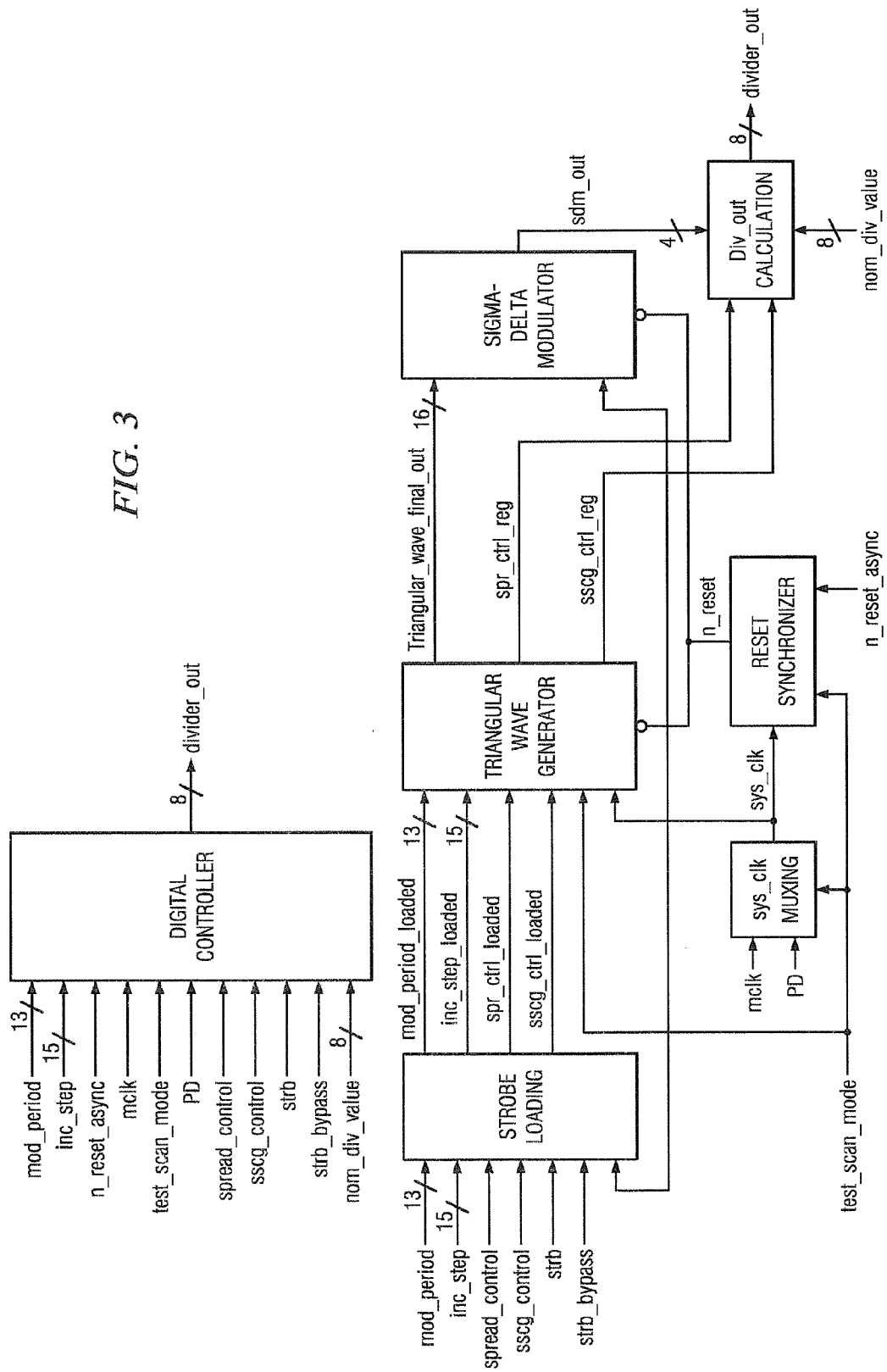
FIG. 3 shows a Spread Spectrum Clock Generator Controller according to one embodiment of the present disclosure.

This arrangement provides the following features:
programmable Modulation period.
programmable Modulation depth. (Recommended range is 0.25-4%)
Controllable Spread (Down-spread or Center-spread).
The Digital controller, as shown in FIG. 3, contains two main blocks—the Triangular wave generator and the Sigma- Delta modulator (SDM). The Triangular Wave Generator is the block that generates a linear modulation profile based on the external configuration inputs inc_step and mod_period which configure the amplitude (depth) and the frequency of the modulation profile. After the corresponding modulation profile is created it is passed through the SDM modulator which represents the same profile in a reduced bit count and higher resolution (in a limited bandwidth) by pushing the quantization noise into the higher frequency range. The order of the Sigma-Delta converter is fixed. (as 2nd order, however can be increased to a higher order with the structure still being the same but the loop filter being of higher order to allow for higher order noise shaping of the quantization noise, the related internal precision and noise levels needed at the quantizer can easily be calculated for those skilled in this field) The reduced bit width SDM output which represents the modulation profile and the nominal divider value is passed to a divider output calculation block which performs the necessary arithmetic operation depending upon the spread mode selection and provides the divider control bits which are used to control the loop division value of the PLL.

Figure 4:
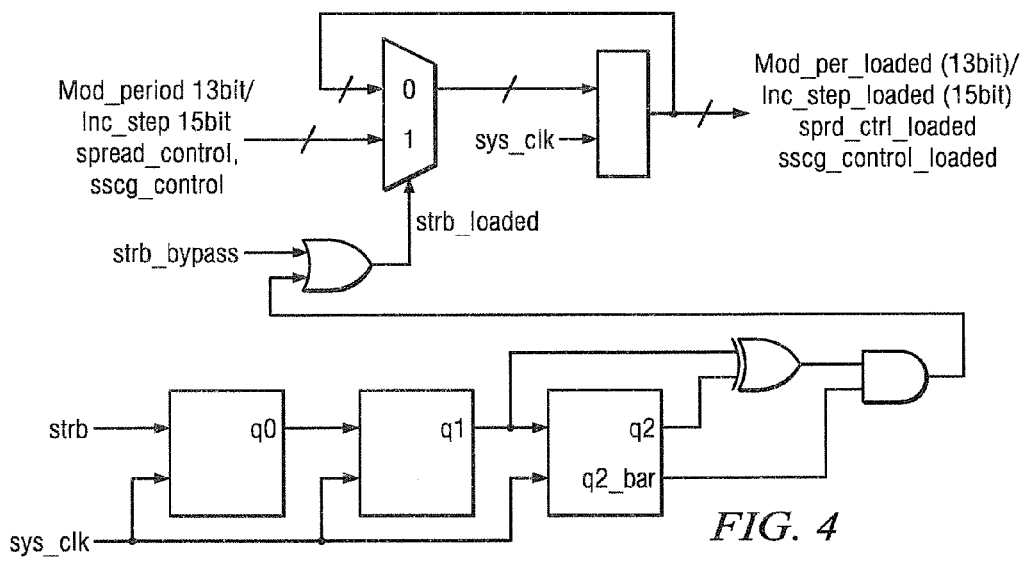
FIG. 4 shows the architecture of Strobe loading according to one embodiment of the present disclosure.

The Strobe_loading block as shown in FIG. 4 is responsible for loading of the input (asynchronous) values synchronously with the internal system clock and the synchronized strobe signal.

For an 8-bit Frequency Divider the maximum N-bit divider value is 255, therefore the Total Value=Nominal value+change in divider value should not exceed this max. value. Modulation frequency and Mod_depth values are selected and the Mod_period and Inc_step are calculated depending on these values. The Mod_period and Inc_step values are programmed for generating the desired triangular wave form.

If we take fnom at the center frequency and the modulated frequency spread is on both sides, then it is called as center-spread. If fnom as the max and the total spread is towards the low frequency side, then it is called as down-spread.

Figure 5:
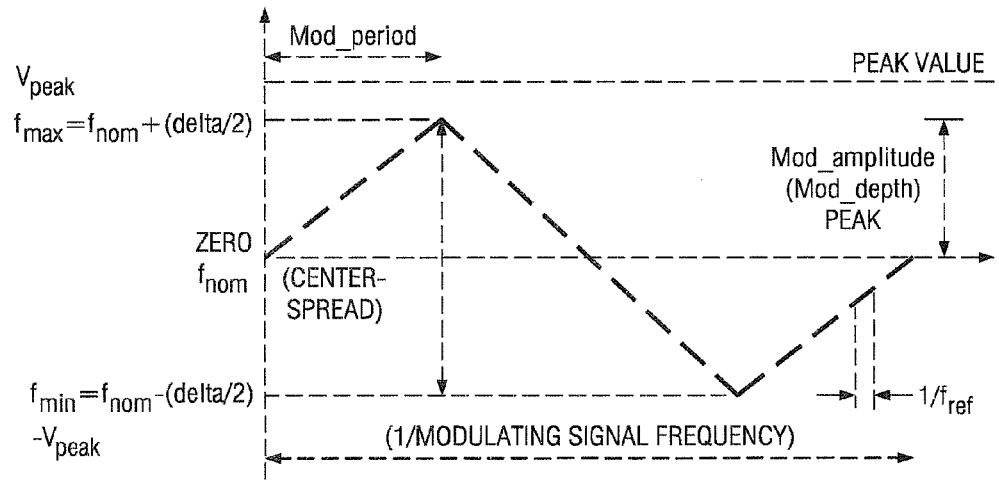
FIG. 5 shows a modulating wave-form for Center-spread frequency modulation, according to one embodiment of the present disclosure.
Figure 6:
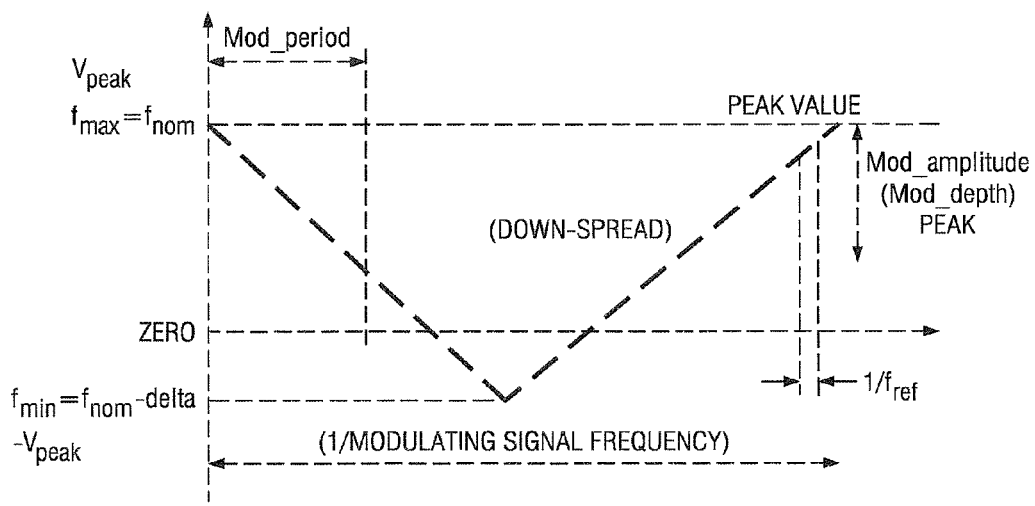
FIG. 6 shows a modulating wave-form for Down-spread frequency modulation according to one embodiment of the present disclosure.

FIG. 5 and FIG. 6 show the modulating signal and the frequency modulation done with the modulating signal for both the center-spread and down-spread cases.

Formulae:

The following formulae show how the mod_period and inc_step values are calculated and programmed given the modulation period and depth. The calculation shown above is based on a 16 bit accumulator implementation and can be easily adopted for any accumulator width and even a higher order sigma modulator.

Mod_period gives the integer count of the number of samples (spaced apart by 1/fref) in one phase period of the triangular wave form.

Modulation signal frequency $f_{mod}=f_{ref}/(4*Mod\_period)$ where Mod_period is programmed using 13 bit representation.

Modulation depth defines the Modulation amplitude. The Modulation depth is given by the following formula:

$$Mod depth(\%) = \frac{\text{deviation in frequency(delta)}}{f_{nom}} \times 100$$

(or)

$$Mod depth(\%) = \frac{\text{Change in Divider Value}}{\text{Nominal Value}} \times 100$$

(where mod_depth varies from 0.25% to 4%).

Assume full scale amplitude is given by a 16 bit value (i.e., $2^{15}-1$). Assume also that Modulation amplitude is given by:

$$V_{peak} = \frac{(2^{15}-1)*\text{mod depth(peak)}*Mdiv}{100*5, \text{(signal level contribution)}}$$

Assume further that the modulation amplitude extends upto mod_period in steps of Inc_step. So, Inc_step=Modulation amplitude/Mod_period. Finally, the input values are given as follows:

$$\text{Mod period(13 bit)} = \frac{fref}{4*f_{mod}}$$

$$Incstep(15\text{bit}) = \text{floor} \frac{(2^{15}-1)*\text{mod depth(peak)}*Mdiv}{100*5, \text{(signal level contribution)}*Modperiod}$$

Figure 7:
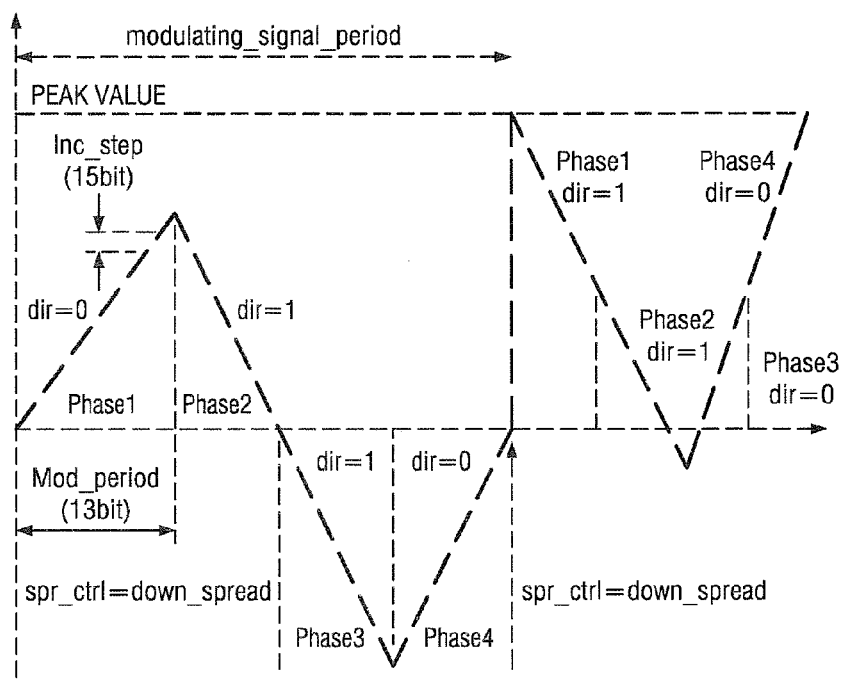
FIG. 7 illustrates a wave-form showing the Mod_period, Inc_step and the output samples for down-spread frequency modulation according to one embodiment of the present disclosure.

In FIG. 7, the wave-form shows the Mod_period, Inc_step and the output samples which are spaced apart by the reference clock period. This is shown for the down-spread case without showing the offset level shift.

Design Conditions.

1. Mod_period, Inc_step values need to be loaded initially before starting the process and at the end of each cycle. No variation of the values are to be allowed before completing a cycle as a complete cycle needs to be calculated by a fixed mod_period and inc_step values.

2. Reset may/may not be provided to the system. So, the system needs to be free running even if there is no reset. Reset should be utilized just for initializing all signal values. Even if there is no reset, the system should be self-initialized within a cycle period.

3. Proper saturation is necessary to guard against wrong programming of Mod_period and Inc_step.

4. There should be a provision for spread_control also where the system needs to be able to provide the output for both center-spread and down-spread. In down-spread, the output should start from the peak value.

TABLE 3

Figure 8:
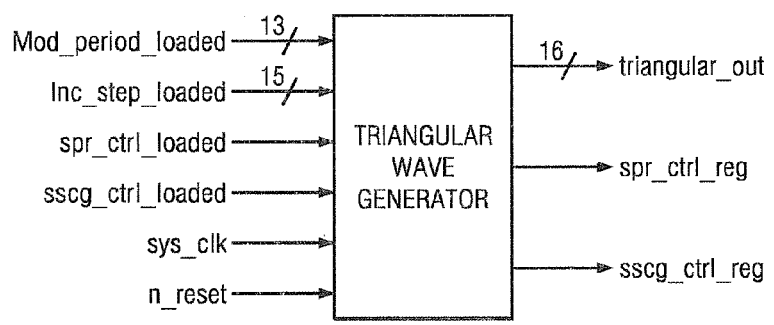
FIG. 8 shows a triangular wave generator according to one embodiment of the present disclosure.

Signal description of Triangular wave generation (FIG. 8)

| Name | I/O | Size | Description |
|---|---|---|---|
| Mod_period_loaded | I | 13 | Modulation period input loaded with strb |
| Inc_step_loaded | I | 15 | Incremental step input loaded with strb |
| spr_ctrl_loaded | I | 1 | Spread control input loaded with strb |
| sscg_ctrl_loaded | I | 1 | SSCG control input loaded with strb |
| sys_clk | I | 1 | Clock |
| reset | I | 1 | Reset |
| triangular_out | O | 16 | Triangular wave output |
| spr_ctrl_reg | O | 1 | Spread Control registered output |
| sscg_ctrl_reg | O | 1 | SSCG controller registered output |

Figure 9:
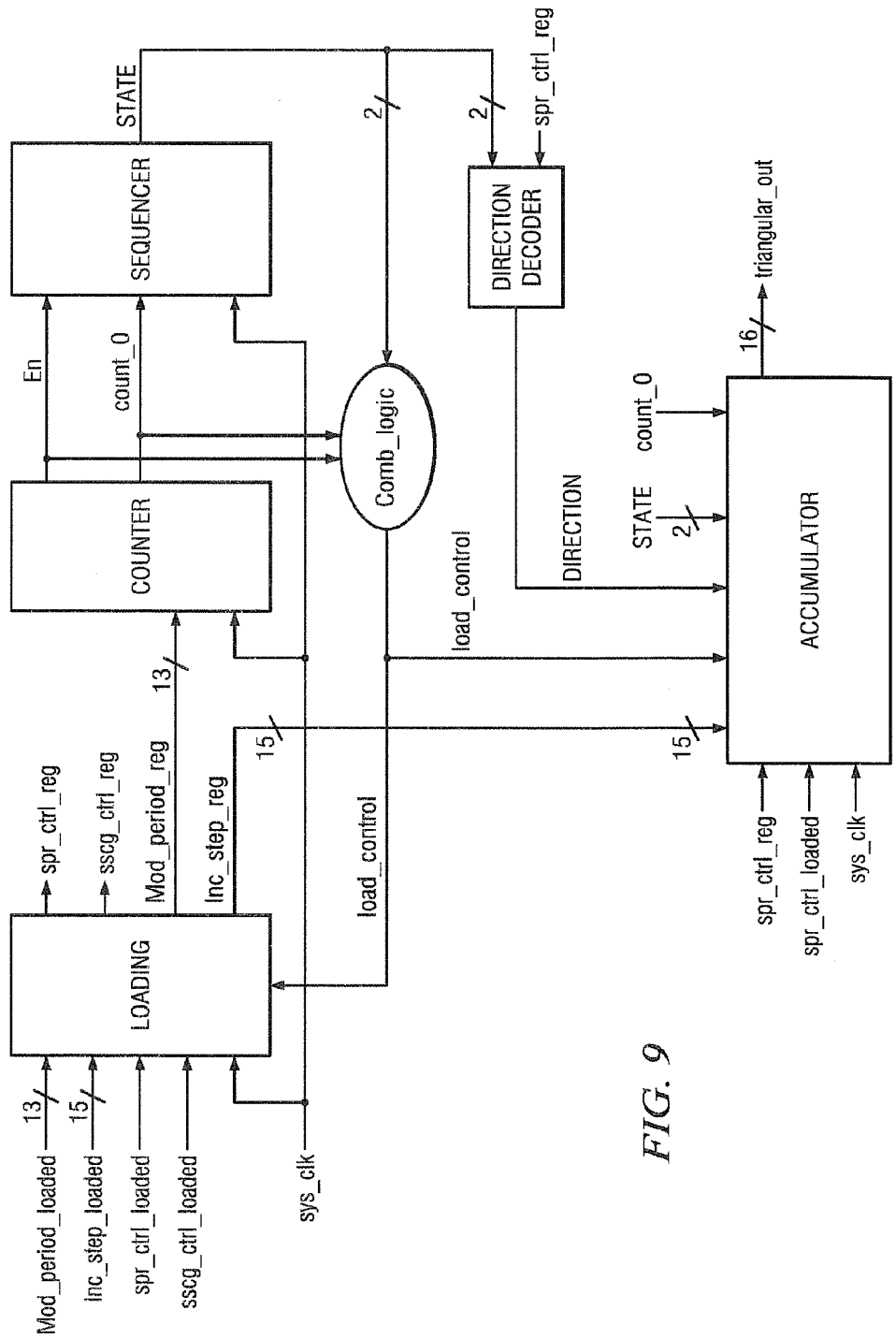
FIG. 9 shows one implementation of the Triangular wave Generator according to one embodiment of the present disclosure.

FIG. 9 shows the complete architecture for the triangular wave generation. A Reset signal is not shown in this architecture as it is an optional signal. However all flip-flops are considered to be resettable.

Design Procedure

1. For Triangular wave generation, the output sample value is determined by performing the arithmetic operation with the Inc_step value on the previous output sample value. This arithmetic operation can be addition/subtraction which can vary for each mod_period. In accordance with the change in arithmetic operation direction, the triangular wave is divided into 4 phases. Phase1, Phase2, Phase3, and Phase4. that run primarily on two state machines. One to count the mod_period value. The other to sequence the phases.

2. In each phase, a decision is taken whether to increment or decrement the output sample value and the appropriate signal direction is selected.

For center spread, depending on the phase state, the direction is decided as follows.

For Phase1, Phase4 - - - direction=0 (Addition)
For Phase2, Phase3 - - - direction=1 (Subtraction)

3. A Counter FSM which runs at the System clock speed is given below. Whenever it reaches the value (mod_period−1), it sets the En signal high which can be used to change the Phase of the Sequencer FSM. At any point of time, if mod_period is zero, Count_0 flag is set which disables the triangular output to prevent any non-zero output for zero mod_period. This flag is connected to the sequencer state machine also to enable free running operation for a zero mod_period.

4. The sequencer causes the control to change to the next phase whenever En=1 or Count_0 flag=1. The Sequencer FSM also runs at system clock speed and is shown below.

5. Subtraction can be done by adding the negative signed 2s complement of the Inc_step to the previous accumulated value.

6. Loading new input values is achieved by enabling a signal (load_ctrl) at the end of each Phase4. These values are loaded synchronously with sys_clk.

If the Mod_period=zero at any time (after reset gets released or mod_period value itself is zero), the system can cease to operate as the counter stops counting leading to problems with En and load_ctrl. If load_control doesn't become high, the next mod_period value will not get loaded causing system malfunction. For this reason, the Count_0 flag is combined with En at the end of phase4 to make load_ctrl high, whenever mod_period is zero in order to load new inputs.

So, load_control=(En or count_0) and phase4. This is shown as combo_logic in the architecture below.

7. Any wrong programming of inputs can cause overflow beyond the peak values in that phase.

For centre spread, the output is saturated to an appropriate value depending on the Phase as follows.
If it is Phase1 & sign bit/MSB of output is 1=>Out= "0111 . . . "
If it is Phase2 & sign bit/MSB of output is 1=>Out= "0000 . . . "
If it is Phase3 & sign bit/MSB of output is 0=>Out= "1000 . . . "
If is Phase4 & sign bit/MSB of output is 0=>Out= "0000 . . . "
NOTE: The whole of the above discussion is valid if we have centre-spread only. Inorder to include down-spread feature, a few modifications are required.

8. In down-spread, we follow the procedure given below.
Starting from the peak value, subtraction is performed for the first two phases and addition for another two phases. Since the peak value corresponds to 5 levels of SDM output, 5 levels are subtracted from the SDM output to get the down side spread.

9. Depending on the phase state, the direction is decided as follows.
For Phase1, Phase2 - - - direction=1 (Subtraction)
For Phase3, Phase4 - - - direction=0 (Addition)

10. Any incorrect programming of inputs can exceed the saturation limits in that phase.

For down-spread, Saturation of the output to appropriate values, depending on the Phase, is performed as follows.
If it is Phase1 & saturation is detected=>Out="0000 . . . " or "1000 . . . "
If it is Phase2 & saturation is detected=>Out="1000 . . . "
If it is Phase3 & saturation is detected=>Out="0000 . . . " or "0111 . . . "
If is Phase4 & saturation is detected=>Out="0111 . . . "

11. If there is no reset, the system can start with a random value of output. This is overcome by initializing the accumulator register output to zero at the end of every cycle as the output sample value reaches the peak value at the end of every cycle.

12. If there is any sudden change in spread control or sscg control, spikes can be generated in the triangular output. Therefore any change of spread control and sscg control are registered with load_control at the end of the cycle.

Each block in the architecture is explained in the following description including Signal description, Logic diagram and architecture.

Loading.

Figure 10:
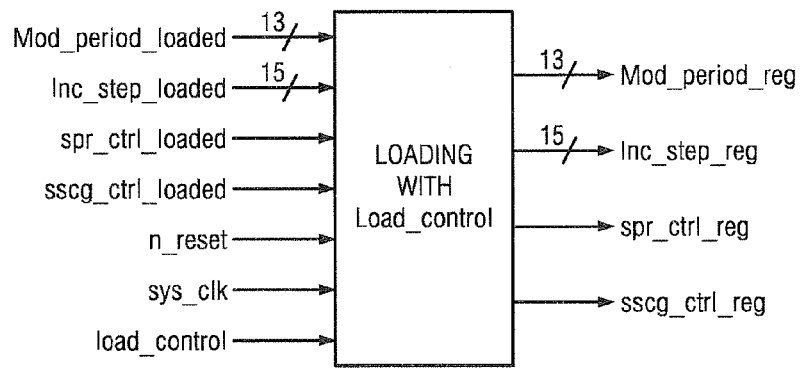
FIG. 10 shows loading of input values with the load_control at the end of phase 4 according to one embodiment of the present disclosure.
Figure 11:
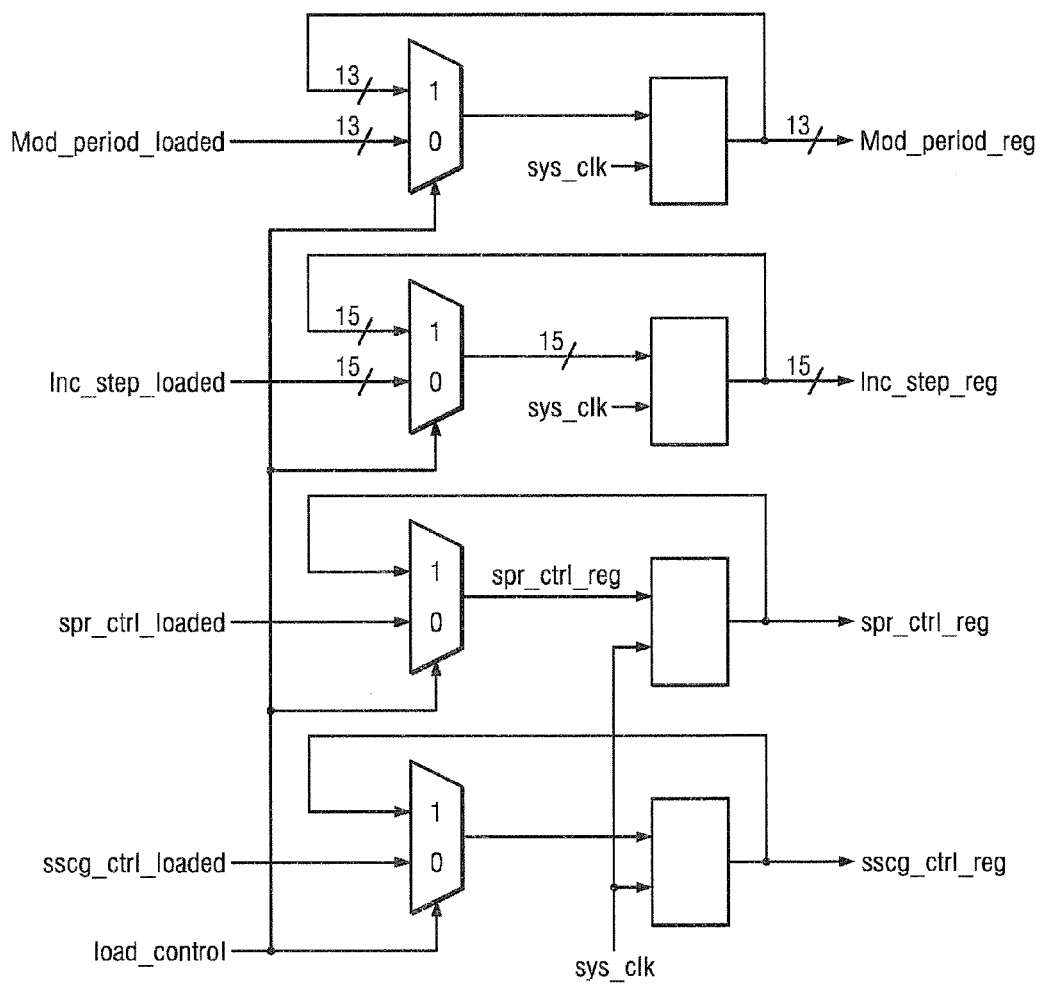
FIG. 11 shows one implementation of loading with Load_ control according to one embodiment of the present disclosure.

Purpose: To load the input values with the load_control at the end of phase4 (after the complete cycle is over). (FIGS. 10 & 11)

Figure 12:
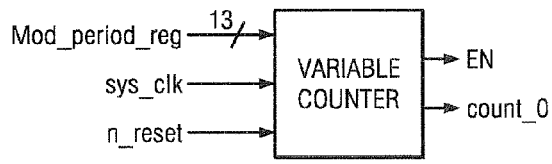
FIG. 12 shows the Variable Counter according to one embodiment of the present disclosure.
Figure 13:
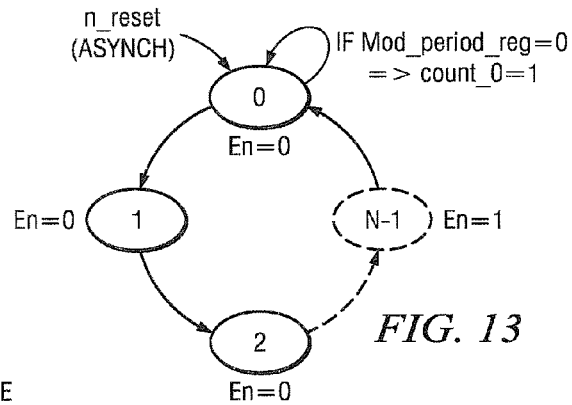
FIG. 13 shows one implementation of the Variable Counter according to one embodiment of the present disclosure.

Variable Counter FSM (FIGS. 12 & 13)
1. "En" signal goes high whenever counter reaches (mod_period−1) value.
2. "Count_0" flag goes high when the mod_period value is zero.

Figure 14:
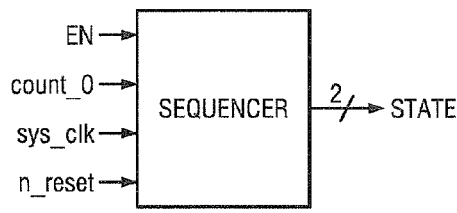
FIG. 14 shows the Sequencer according to one embodiment of the present disclosure.
Figure 15:
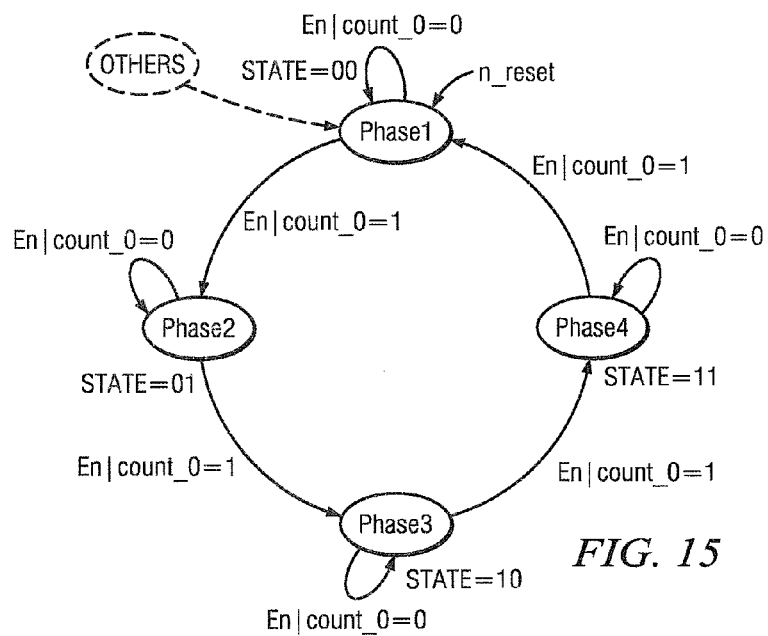
FIG. 15 shows one implementation of the Sequencer according to one embodiment of the present disclosure.

Sequencer FSM (FIGS. 14 & 15):
Purpose:
1. Change the phase of the FSM depending on "En" and "count_0" signals.
2. Useful for direction decoding as well as saturation of the output Direction Decoder (FIG. 16):
Purpose: Determining direction depending on the spread and Phase state.

Accumulator (FIGS. 17 & 18)
Purpose:
1. Calculate the triangular wave sample values depending on inc_step and direction.
2. Limit to the appropriate saturation values depending on phase state and spread
3. Disable the output for zero mod_period value
4. Initialize to the start value (zero or peak) depending on the spread (need to look at the change in spread) at the end of each cycle.

Figure 19:
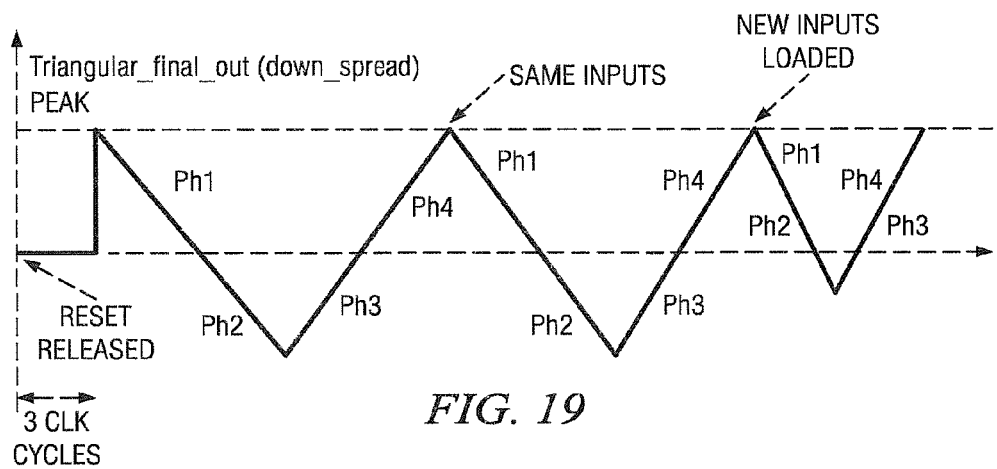
FIG. 19 illustrates the triangular wave-form showing final output for down_spread operation according to one embodiment of the present disclosure.
Figure 20:
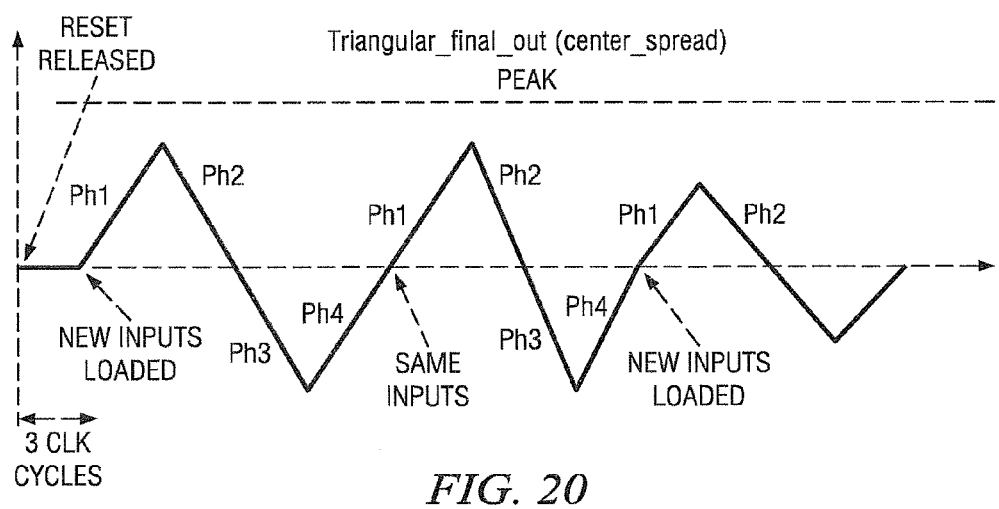
FIG. 20 illustrates the triangular wave-form showing final output for center_spread operation according to one embodiment of the present disclosure.

FIGS. 19 and 20 show the triangular wave final output for both down_spread and centerspread operation.

Sigma-Delta Modulator

Figure 21:
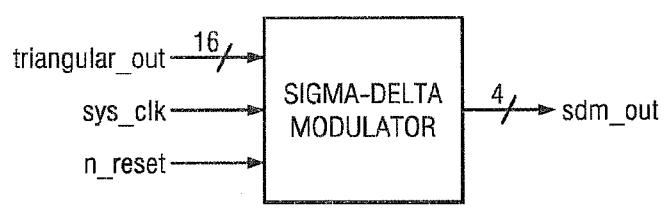
FIG. 21 shows the Sigma Delta Modulator according to one embodiment of the present disclosure.
Figures 22, 23:
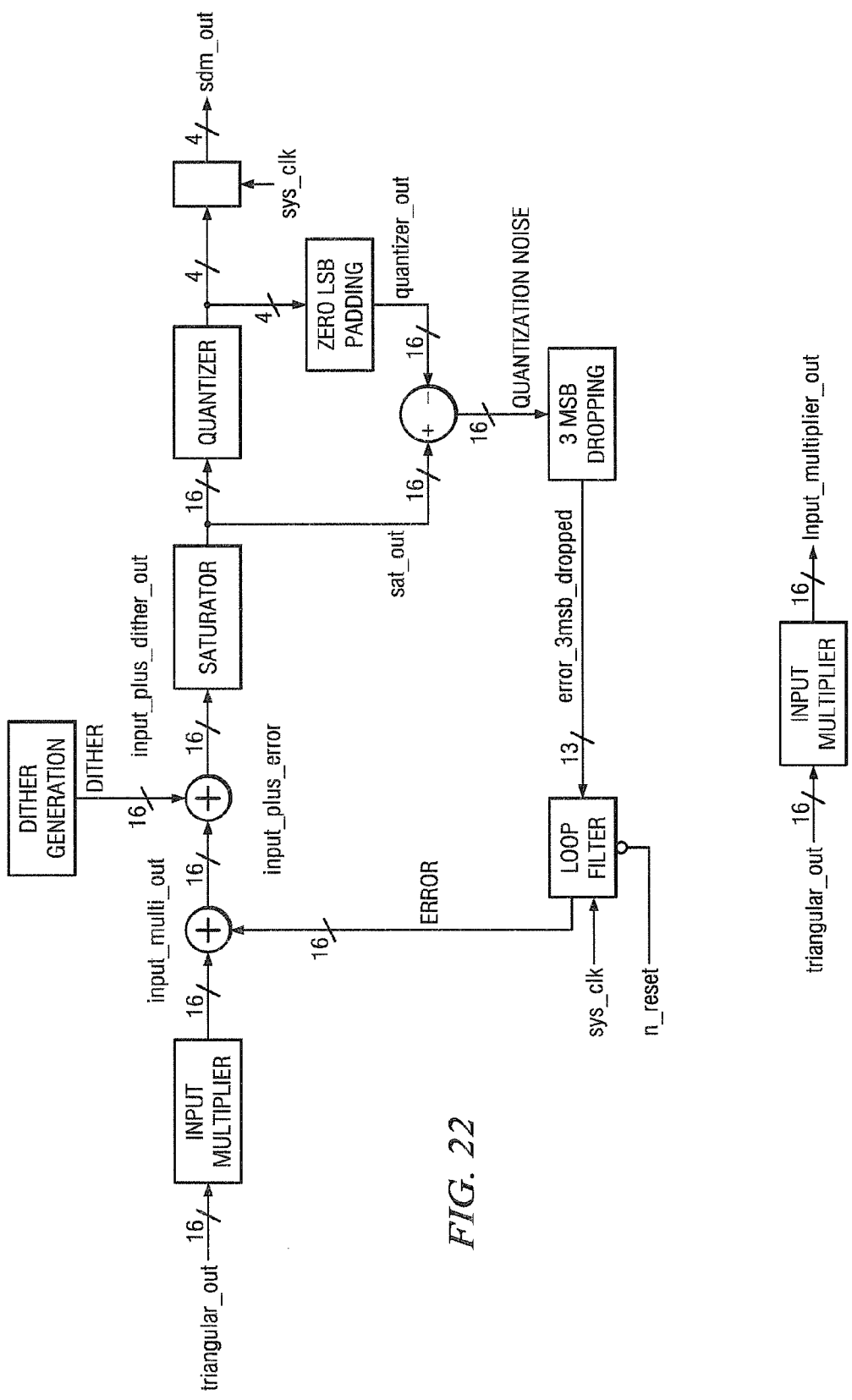
FIG. 22 shows the implementation of the Sigma-Delta Modulator according to one embodiment of the present disclosure.
FIG. 23 shows the input multiplier according to one embodiment of the present disclosure.

FIG. 21 and FIG. 22 show the design of the Sigma-Delta Modulator (SDM). The SDM uses an error feedback architecture.

The divider control bit depth is limited so we need to maintain a high resolution to represent the modulating signal (modulation profile generated by triangular wave generator). As the bandwidth required to represent the modulation profile is limited compared to the input frequency, we use a sigma-delta modulator to convert the high resolution PCM coded modulation profile (ex 16 bits) to a few number of levels (15 in this case). The output will represent the signal information with a certain percentage level and the remaining is quantization noise contribution, which is shaped by the noise transfer function of the sigma-delta modulator.

The modulator output sees the closed loop transfer function of the PLL, as a low-pass filter. The pass band of the low pass transfer function should be narrow enough to ensure that the relevant (high energy) spectral components of the modulation profile are attenuated The ratio of signal components to the integrated noise energy upto the limit frequency (input frequency/2) gives the signal-to-noise ratio of the modulation profile. As the ratio of the input frequency to the bandwidth of modulator is high, we get a high signal to noise ratio.

The architecture chosen is that of a second order modulator, which contains Loop filter, Saturator, Quantizer blocks along with an input multiplier block. The following diagram illustrates this architecture.

Figure 24:
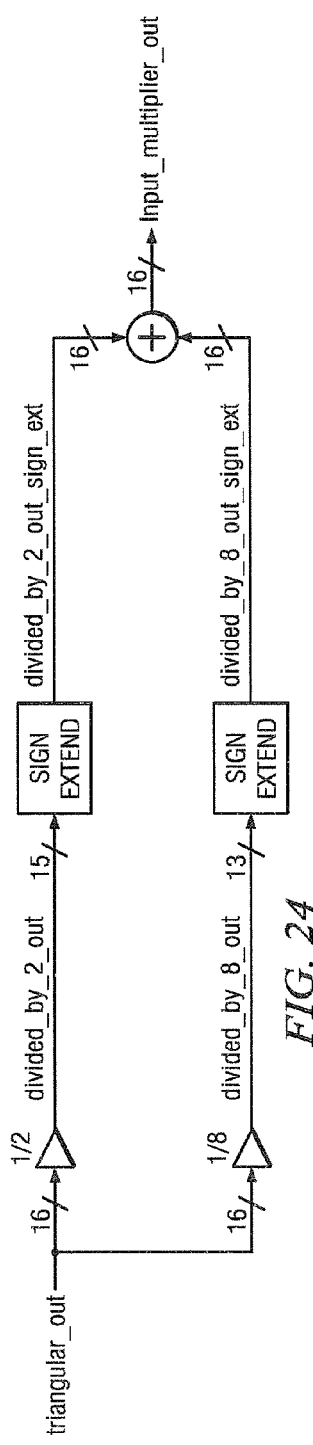
FIG. 24 illustrates one implementation of the input multiplier according to one embodiment of the present disclosure.

Input Multiplier (FIGS. 23 & 24):

The Input multiplier block is used to multiply the triangular wave sample values with 0.625. The selection of the multiplier value is done as follows:

The total no. of quantizer levels are 15. Those are the 0 level, 7 levels on the positive side and 7 levels on the negative side. If we take one side, signal contribution is limited to 5 levels out of 7 levels. The remaining 2 levels are left for possible noise contribution.

Delta value is kept as a power of 2 to make the quantizer (Midtread is taken here) hardware implementation easier.

The peak value of the triangular 16 bit input can be $2^{15}=32768$.

The input signal can occupy 10 levels. So, the delta value for the quantizer is calculated as $$\text{delta}=2^{(\text{floor}(\log 2(32767/5)))}=4096$$

The total no. of values that the quantizer can occupy are $4096*5=20480$,

So, to efficiently map all the possible sample values, the input multiplier value should be $(5*4096)/32768=0.625$ This multiplication factor is to be achieved with less hardware logic. This value can be easily implemented as $(1/2+1/2^3)$. The divide-by-2 operation can be implemented by the LSB dropping method. The Input multiplier is shown in the diagram. Sign extension is added to maintain the same no. of bits without changing the value.

Figure 25:
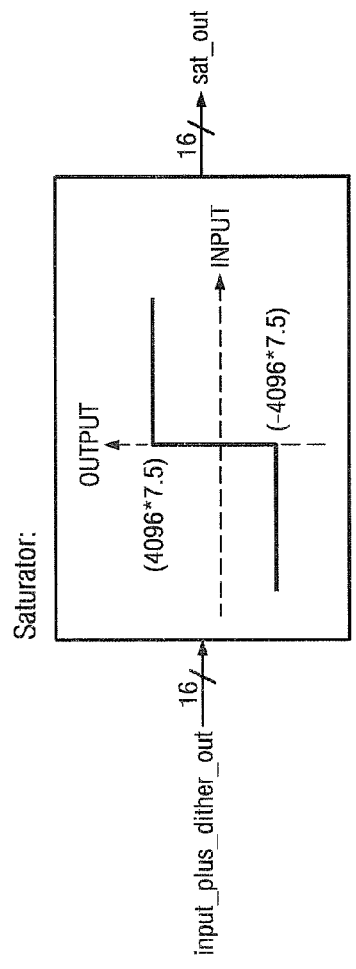
FIG. 25 shows the Saturator according to one embodiment of the present disclosure.

Saturator (FIG. 25):

Saturator is included before the quantizer so as to limit the input.

As the quantizer allows input values up to $+/-4096*7.5$, the saturator is also designed to saturate to those values. The saturator is active when the input is out of range $+/-4096*7.5$. Otherwise, the input is passed directly to the output.

3MSB Dropping:

The max quantization noise can be $+/-2048$ which can be represented by 13 bits. So, we can drop 3 MSB's to reduce the no. of bits so that the reduction of hardware in the subsequent block is possible. Sign extensions are done here also as explained above.

Figure 26:
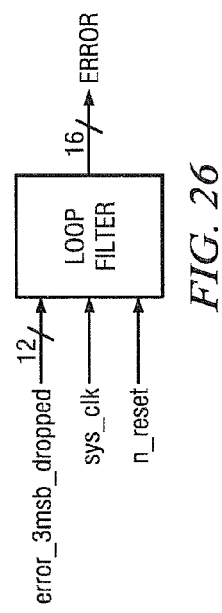
FIG. 26 shows the Loop Filter according to one embodiment of the present disclosure.
Figure 27:
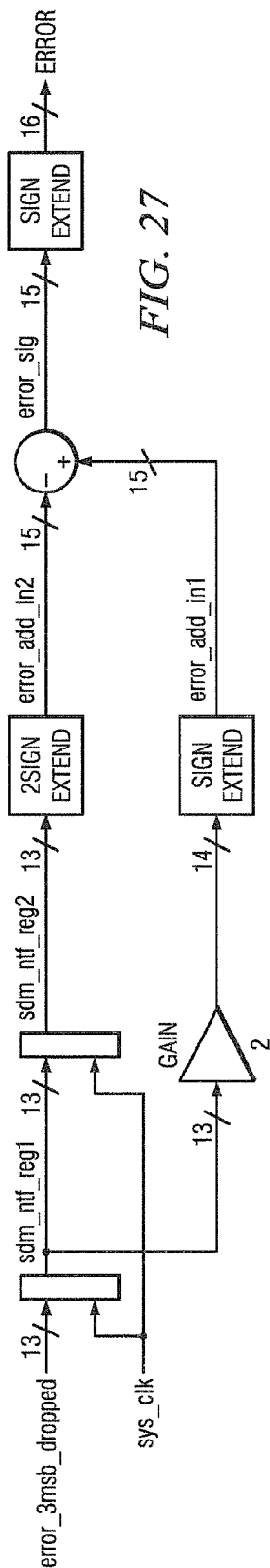
FIG. 27 illustrates one implementation of the Loop Filter according to one embodiment of the present disclosure.

Loop Filter (FIGS. 26 & 27):

The Loop filter is implemented as a second order noise transfer function using Second order noise shaping as follows.

Loop Filter Transfer function $H(z)=2z^{-1}-z^{-2}$ $$NTF=E(z)=|1-H(z)|=1-(2z^{-1}-z^{-2})=(1-z^{-1})^2$$

Figure 28:
FIG. 28 shows the Quantizer according to one embodiment of the present disclosure.
Figure 29:
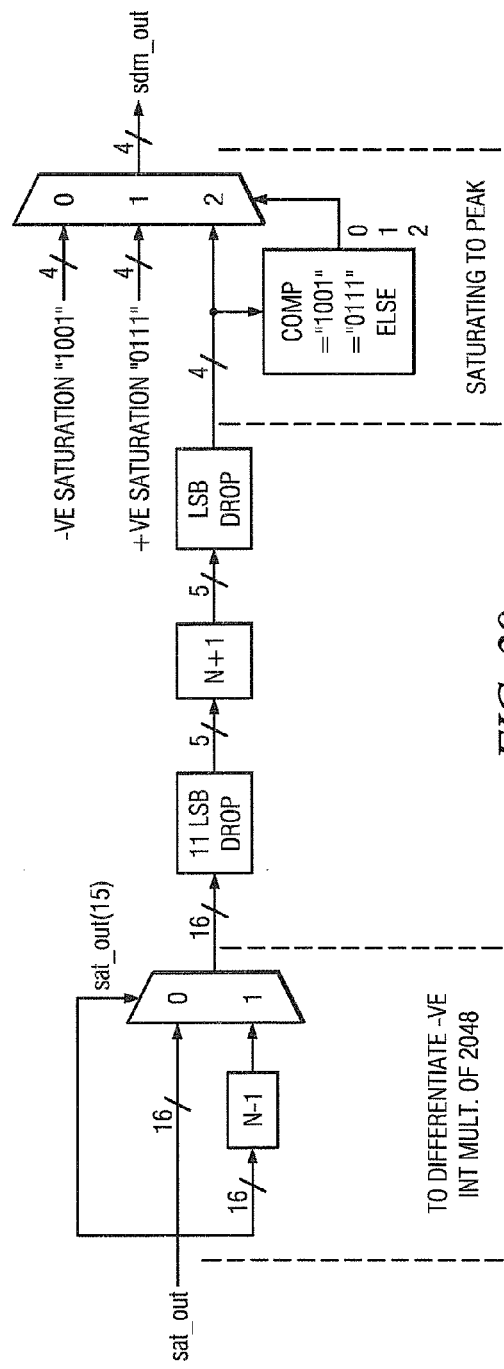
FIG. 29 shows one implementation of the Quantizer according to one embodiment of the present disclosure.

Quantizer (FIGS. 28 & 29):

Quantizer (mid-tread) implementation is shown above. This is implemented as follows.

1. By dropping 11 LSB's, we get 16 bit representation into 15 levels (taking a single side). These 15 levels can be mapped to 7 levels by adding '1' and dropping an LSB.

2. The input values to quantizer are in 2's complement mode, Therefore, inorder to differentiate the negative integer multiples of 2048 and map them to the right quantizer level, '1' is subtracted from the input.

For ex; $-2048=\text{"1111100000000000"}$ needs to be mapped to $-1$ rather than to 0. So, 1 is subtracted from the input if it is a negative value.

3. The input is saturated if the value exceeds $+14\text{Delta}/2$ or $-14\text{Delta}/2$ which need to be mapped to $+7$ or $-7$ respectively.

Zero Padding:

12LSB zero padding is done to get the quantizer value as the gain factor is 4096.

Figure 30:
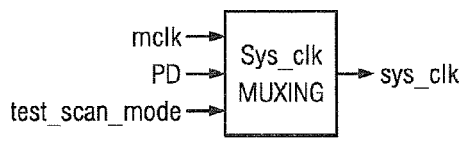
FIG. 30 shows the process of Sys_clk muxing according to one embodiment of the present disclosure.
Figure 31:
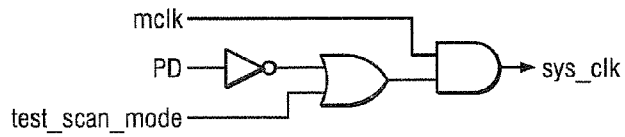
FIG. 31 shows the Sys_Clk Muxing arrangement according to one embodiment of the present disclosure.

Sys_clk Muxing (FIGS. 30 & 31)

Purpose: Muxing the PowerDown signal with master clock.

Figure 32:
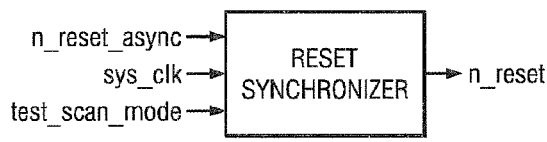
FIG. 32 shows the Reset Synchronizer according to one embodiment of the present disclosure.
Figure 33:
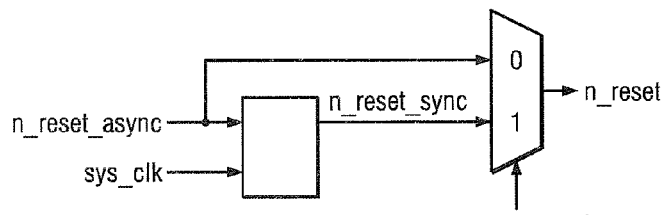
FIG. 33 shows one implementation of the Reset Synchronizer according to one embodiment of the present disclosure.

Reset Synchronizer (FIGS. 32 & 33):

Purpose: To synchronize the asynchronous reset signal with the internal clock for test purposes.

Figure 34:
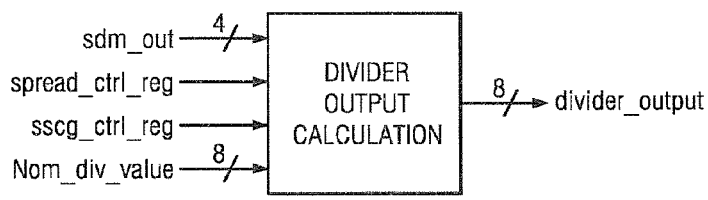
FIG. 34 illustrates the process of Divider output calculation according to one embodiment of the present disclosure.
Figure 35:
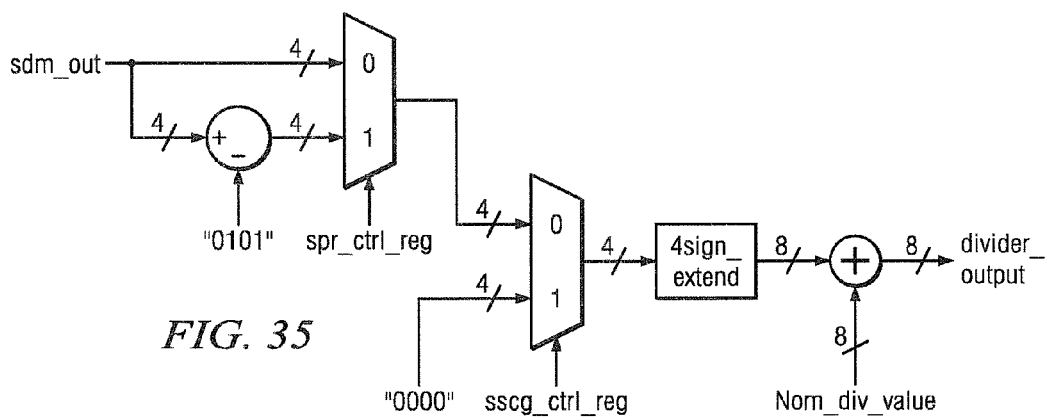
FIG. 35 shows the Divide Output Calculator according to one embodiment of the present disclosure.

Div_out_calcualtion: (FIGS. 34 & 35)

Purpose:

1. For down-spread, we need to subtract 5 (signal content) from the SDM output to get the spread under the nominal value.

2. When SSCG is off, the modulation profile needs to be disabled.

3. The SDM output gives the deviation value in a $+/-7$ range. And, this needs to be added to the nominal divider value to get the divider output for frequency modulation.

It may be advantageous to set forth definitions of certain words and phrases used in this patent document. The term "couple" and its derivatives refer to any direct or indirect communication between two or more elements, whether or not those elements are in physical contact with one another. The terms "include" and "comprise," as well as derivatives thereof, mean inclusion without limitation. The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

While this present disclosure has described certain embodiments and generally associated methods, alterations and permutations of these embodiments and methods will be apparent to those skilled in the art. Accordingly, the above description of example embodiments does not define or constrain this present disclosure. Other changes, substitutions, and alterations are also possible without departing from the spirit and scope of this present disclosure, as defined by the following claims.

What is claimed is:

1. A spread spectrum clock generation system comprising:
a digitally controlled phase locked loop (PLL) circuit; and
a digital frequency profile generator connected to the digital control input of said PLL circuit, wherein said digital frequency profile generator comprises a triangular wave generator and a second order sigma-delta modulator (SDM) connected to an output of said triangular wave generator, wherein said triangle wave generator comprises a first state machine having a first set of inputs connected to an output of a synchronizer to generate an output count corresponding to input amplitude and frequency values and a second state machine having a first set of inputs connected to the output of said synchronizer and a second set of inputs connected to an output of said first state machine with its output being fed back to a second set of inputs of said first state machine, to sequence phases of a triangular wave.

2. The system according to claim 1, wherein
the synchronizer to synchronize input asynchronous amplitude and frequency values to an internal system clock.

3. The system according to claim 1, wherein said second order sigma-delta modulator comprises:
a constant multiplier;
a first adder having one input connected to the output of said multiplier;
a second adder having one input connected to the output of said first adder;
a ditherer connected to the second input of said second adder;
a saturator connected to the output of said second adder;
a quantizer connected to the output of the saturator;
a synchronizer connected to the output of said quantizer;
a zero LSB padder having its input connected to the output of said quantizer;
a difference generator having one input connected to the output of said zero LSB padder and its second input connected to the output of said saturator;
a 3 MSB dropping block connected to the output of said difference generator; and
a loop filter having its input connected to the output of said 3 MSB dropping block, wherein the output of said loop filter connected to the second input of said first adder.

4. The system according to claim 1, wherein said triangle wave generator is configurable for a specified amplitude and frequency and provides two operational modes.

5. The system according to claim 4, wherein a first mode of the two operation modes comprises a center-spread mode in which the nominal frequency is the specified clock frequency.

6. The system according to claim 4, wherein a second mode of the two operation modes comprises a down-spread mode in which the maximum frequency is the specified clock frequency and the nominal frequency is offset below the original clock frequency by an amount which is a function of a configurable modulation depth.

7. A method for generating a spread spectrum clock, the method comprising:
providing a digitally controlled phase locked loop (PLL) circuit; and
modulating the frequency generated by said PLL circuit by using a digital frequency profile generator to apply a controlled modulating signal to the digital control input of said PLL circuit, wherein the modulating signal is generated using at least one wave signal, wherein said modulating signal is generated by:
generating a triangular wave signal; and
performing sigma delta modulation on said triangular wave signal.

8. The method according to claim 7, wherein said triangular wave signal is generated by:
synchronously loading amplitude and frequency counts into an up-down count mechanism configured to provide a repetitive triangular cannot pattern based on said amplitude and frequency count values; and
enabling said count mechanism to perform the count operation.

9. The method according to claim 8, wherein said sigma delta modulation comprises:
scaling the input signal;
adding a dither to said scaled input signal;
limiting the value of said dithered output;
quantizing said limited dithered output;
synchronizing said quantized output;
padding said synchronized quantized output with least significant bits;
determining the difference between said limited dithered output and said padded synchronized quantized value;
extracting and filtering a limited value of said difference; and
adding back said filtered difference to said scaled input signal to produce the final output.

10. For use in spread spectrum clock generation, a system for providing center spread and down spread operating modes, the system comprising:
a digitally controlled phase locked loop (PLL) circuit; and
a digital frequency profile generator connected to the digital control input of said PLL circuit, wherein said digital frequency profile generator comprises:
a triangular wave generator; and
a second order sigma-delta modulator (SDM) connected to an output of said triangular wave generator wherein said triangle wave generator comprises a synchronizer to synchronize input asynchronous amplitude and frequency values to an internal system clock, wherein said digital frequency profile generator further comprises a first state machine having a first set of inputs connected to an output of said synchronizer to generate an output count corresponding to input amplitude and frequency values and a second state machine having a first set of inputs connected to the output of said synchronizer and a second set of inputs connected to an output of said first state machine with its output being fed back to a second set of inputs of said first state machine, to sequence phases of triangular wave.

11. The system according to claim 10 wherein said second order sigma-delta modulator comprises:
a constant multiplier;
a first adder having one input connected to the output of said multiplier;
a second adder having one input connected to the output of said first adder;
a ditherer connected to the second input of said second adder;
a saturator connected to the output of said second adder;
a quantizer connected to the output of the saturator;
a synchronizer connected to the output of said quantizer;
a zero LSB padder having its input connected to the output of said quantizer;
a difference generator having one input connected to the output of said zero LSB padder and its second input connected to the output of said saturator;
a 3 MSB dropping block connected to the output of said difference generator; and
a loop filter having its input connected to the output of said 3 MSB dropping block, wherein the output of said loop filter connected to the second input of said first adder.

12. The system according to claim 10, wherein said triangle wave generator is configurable for a specified amplitude and frequency and provides two operational modes.

13. The system according to claim 12, wherein a first mode of the two operation modes comprises a center-spread mode in which the nominal frequency is the specified clock frequency.

14. The system according to claim 12, wherein a second mode of the two operation modes comprises a down-spread mode in which the maximum frequency is the specified clock frequency.

15. The system according to claim 14, wherein the second mode further comprises offsetting the nominal frequency below the original clock frequency by an amount which is a function of a configurable modulation depth.

16. The system according to claim 4, wherein said triangle wave generator comprises:
   a synchronizer configured to synchronize input asynchronous amplitude and frequency values to an internal system clock.

17. The system according to claim 5, wherein the synchronizer is configured to synchronize input asynchronous amplitude and frequency values to an internal system clock.

18. The system according to claim 6, wherein the synchronizer is configured to synchronize input asynchronous amplitude and frequency values to an internal system clock.

19. The system according to claim 11, wherein said triangle wave generator is configurable for a specified amplitude and frequency and provides two operational modes.

20. The method according to claim 7, wherein said triangle wave is configurable for a specified amplitude and frequency.

* * * * *